United States Patent
Shoji

(10) Patent No.: US 10,235,284 B2
(45) Date of Patent: Mar. 19, 2019

(54) MEMORY SYSTEM

(71) Applicant: Toshiba Memory Corporation, Tokyo (JP)

(72) Inventor: Satoshi Shoji, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/693,444

(22) Filed: Aug. 31, 2017

(65) Prior Publication Data
US 2018/0276115 A1 Sep. 27, 2018

(30) Foreign Application Priority Data

Mar. 23, 2017 (JP) .................................. 2017-058217

(51) Int. Cl.
| G11C 8/16 | (2006.01) |
| G06F 12/02 | (2006.01) |
| G06F 3/06 | (2006.01) |
| G06F 13/16 | (2006.01) |

(52) U.S. Cl.
CPC ........ G06F 12/0246 (2013.01); G06F 3/0679 (2013.01); G06F 12/0253 (2013.01); G06F 13/1694 (2013.01); G11C 8/16 (2013.01); *G06F 2212/7205* (2013.01)

(58) Field of Classification Search
CPC .................................. G11C 29/08; G11C 8/16
USPC ............................................. 365/201, 230.05
See application file for complete search history.

(56) References Cited

U.S. PATENT DOCUMENTS

| 6,229,661 B1* | 5/2001 | Abe ....................... G11B 19/04 360/31 |
| 7,315,916 B2 | 1/2008 | Bennett et al. |
| 9,448,919 B1* | 9/2016 | Boyle ..................... G06F 12/02 |
| 9,582,358 B2 | 2/2017 | Agarwal et al. |
| 2006/0271725 A1* | 11/2006 | Wong .................. G06F 12/0246 711/103 |
| 2009/0265403 A1* | 10/2009 | Fukumoto ........... G06F 12/0246 |
| 2010/0274993 A1* | 10/2010 | Golla .................. G06F 9/30109 712/216 |
| 2011/0022784 A1* | 1/2011 | Yano ................... G06F 12/0246 711/103 |
| 2012/0254524 A1 | 10/2012 | Fujimoto |
| 2016/0266792 A1 | 9/2016 | Amaki et al. |
| 2016/0283125 A1* | 9/2016 | Hashimoto ....... G06F 17/30123 |
| 2016/0313943 A1 | 10/2016 | Hashimoto et al. |
| 2017/0075614 A1 | 3/2017 | Kanno |

(Continued)

FOREIGN PATENT DOCUMENTS

| JP | 2011175615 A | 9/2011 |
| JP | 5069256 B2 | 11/2012 |

(Continued)

*Primary Examiner* — Michael Tran
(74) *Attorney, Agent, or Firm* — Kim & Stewart LLP

(57) ABSTRACT

A memory system includes a nonvolatile memory having a plurality of blocks, and a memory controller. The memory controller is configured to control the nonvolatile memory, record an association between a first stream ID and a first block in which first data corresponding to the first stream ID is written, collect information on the first data written into the first block, and invalidate the association between the first stream ID and the first block based on the collected information.

20 Claims, 8 Drawing Sheets

(56) References Cited

U.S. PATENT DOCUMENTS

| | | | | |
|---|---|---|---|---|
| 2017/0220292 A1* | 8/2017 | Hashimoto | ........... | G06F 3/0641 |
| 2017/0235486 A1* | 8/2017 | Martineau | ............... | G06F 3/061 |
| | | | | 711/103 |
| 2018/0107391 A1* | 4/2018 | Hashimoto | ........... | G06F 3/0604 |

FOREIGN PATENT DOCUMENTS

| | | |
|---|---|---|
| JP | 2016-170583 A | 9/2016 |
| JP | 2017054465 A | 3/2017 |

\* cited by examiner

FIG. 3
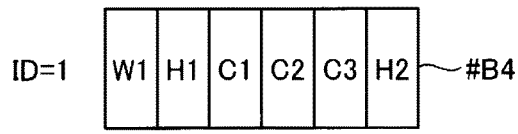
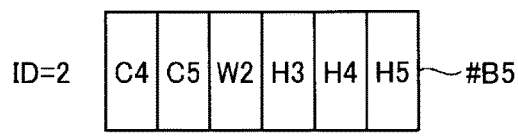
FIG. 4
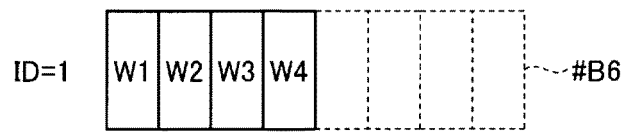
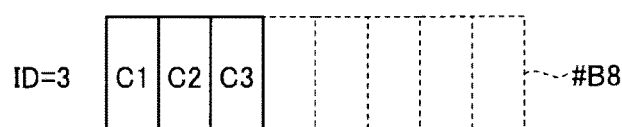
FIG. 5
| STREAM ID | BLOCK ID |
|---|---|
| 1 | #B5, #B6 |
| 2 | #B7 |
| ⋮ | ⋮ |

FIG. 6

STREAM HISTORY INFORMATION 43

| ID | DATA SIZE 43a | PHYSICAL RESOURCE SIZE INFORMATION 43b | INVALIDATED CLUSTER NUMBER 43c | COMPACTION NUMBER 43d | AF VALUE 43e | AF DETERMINATION 43f | CLOSE FG 43g |
|---|---|---|---|---|---|---|---|
| 1 | 54 | 64 | 43 | 3 | 3 | 1 | |
| 2 | 128 | 128 | 0 | 0 | 0 | 0 | |
| ... | ... | ... | ... | ... | ... | ... | ... |

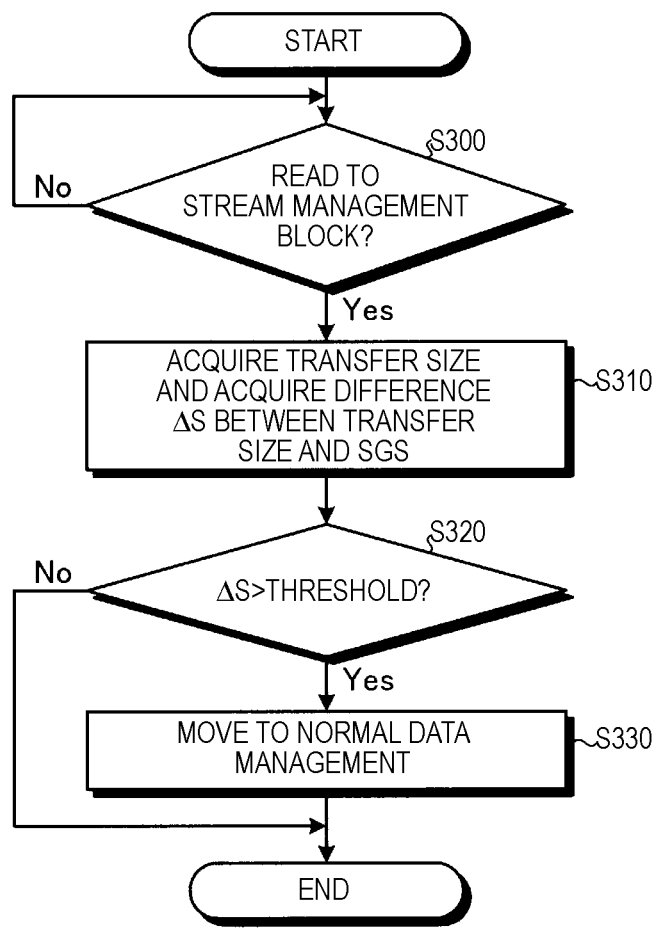

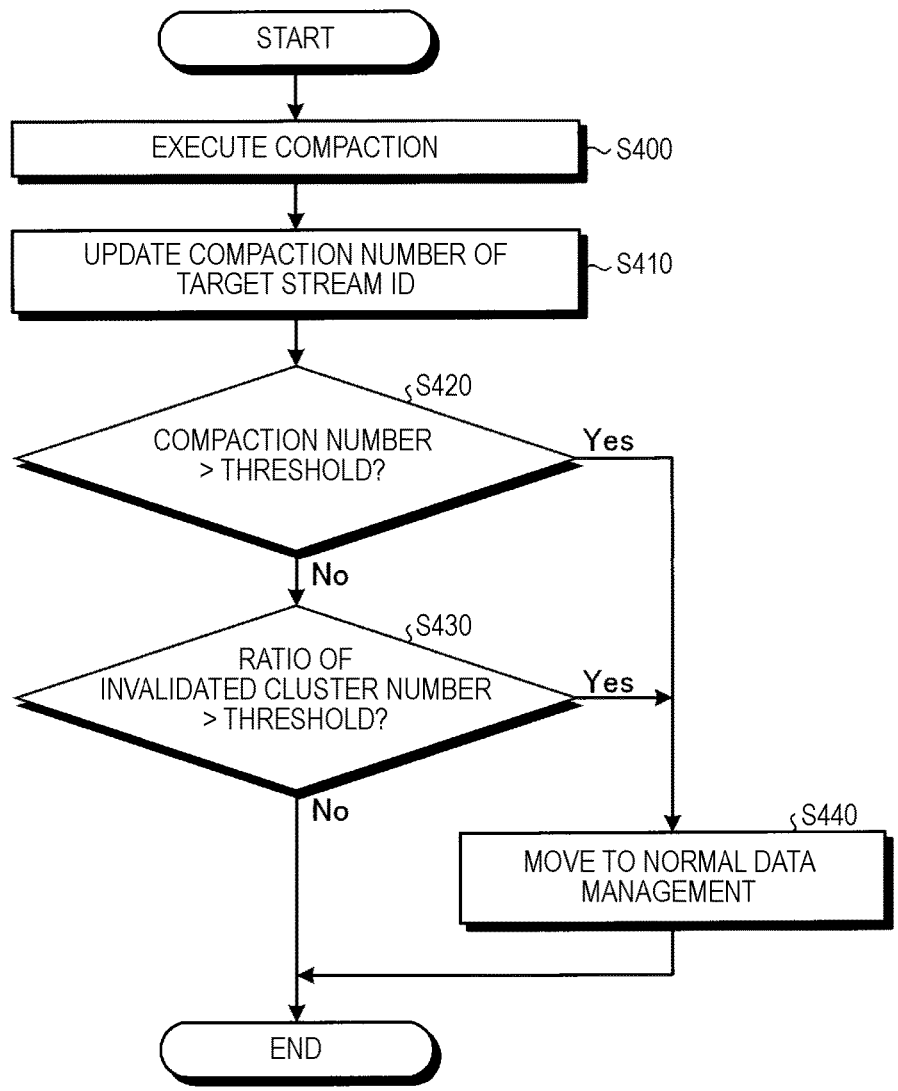

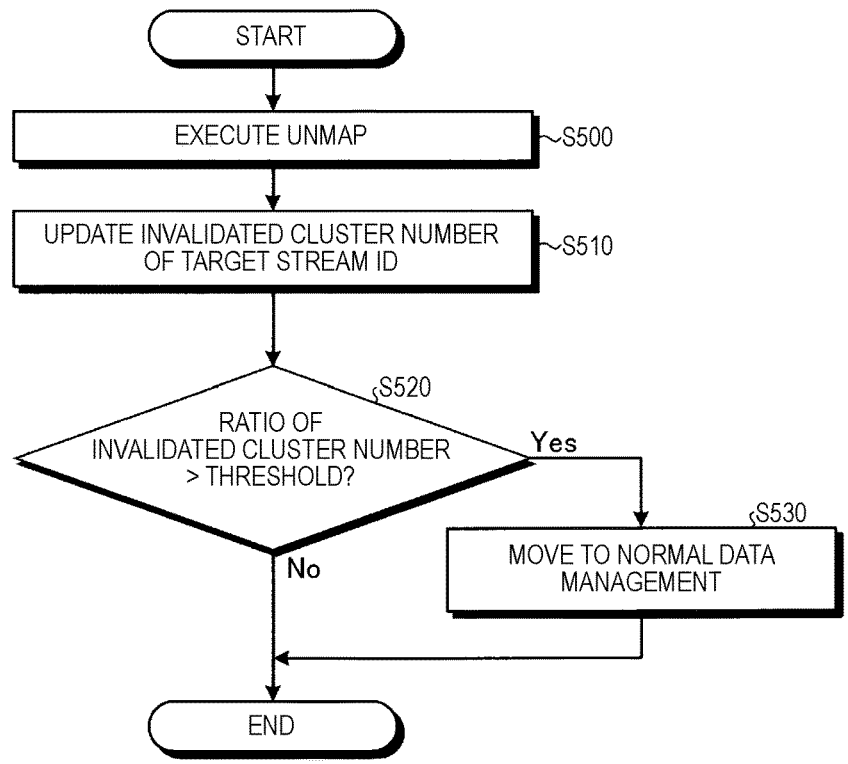
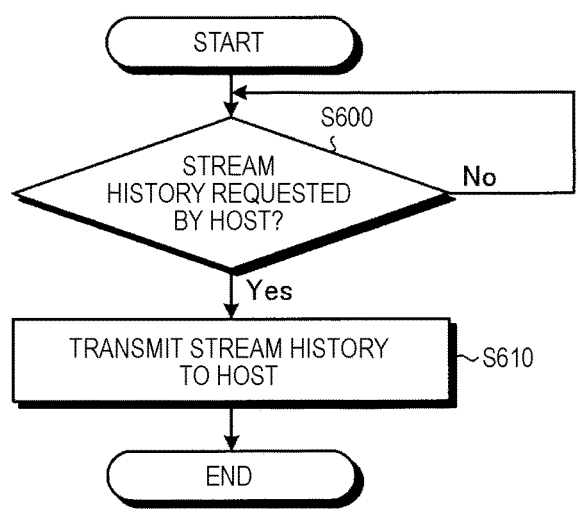

MEMORY SYSTEM

CROSS-REFERENCE TO RELATED APPLICATION

This application is based upon and claims the benefit of priority from Japanese Patent Application No. 2017-058217, filed Mar. 23, 2017, the entire contents of which are incorporated herein by reference.

FIELD

Embodiments described herein relate generally to a memory system including a nonvolatile memory.

BACKGROUND

In a multi-stream control, a host assigns the same stream ID to data expected to have similar lifetimes. The device connected to the host as an external memory writes data having the same stream ID in the same block and writes data having different stream IDs in different blocks.

DESCRIPTION OF THE DRAWINGS

FIG. 3 is a view illustrating a state where the same stream ID is specified for data having different lifetimes.

FIG. 4 is a view illustrating a state where a data transfer size is smaller than a basic data management size.

FIG. 5 is a view illustrating a data structure of stream management information.

FIG. 6 is a view illustrating a data structure of stream history information.

FIG. 8 is a flowchart illustrating an operation procedure of the control unit when a stream read request is received.

FIG. 9 is a flowchart illustrating an operation procedure of the control unit when compaction is executed.

FIG. 10 is a flowchart illustrating an operation procedure of the control unit when a data invalidation command is executed.

FIG. 11 is a flowchart illustrating an operation procedure of a second embodiment of the memory system.

DETAILED DESCRIPTION

Embodiments provide a memory system that performs block allocation with high utilization efficiency to improve the lifetime of nonvolatile memory.

In general, according to one embodiment, a memory system includes a nonvolatile memory having a plurality of blocks, and a memory controller. The memory controller is configured to control the nonvolatile memory, record an association between a first stream ID and a first block in which first data corresponding to the first stream ID is written, collect information on the first data written into the first block, and invalidate the association between the first stream ID and the first block based on the collected information.

Hereinafter, memory systems according to embodiments will be described in detail with reference to the accompanying drawings. Meanwhile, the present disclosure is not limited by these embodiments.

First Embodiment

Figure 1:
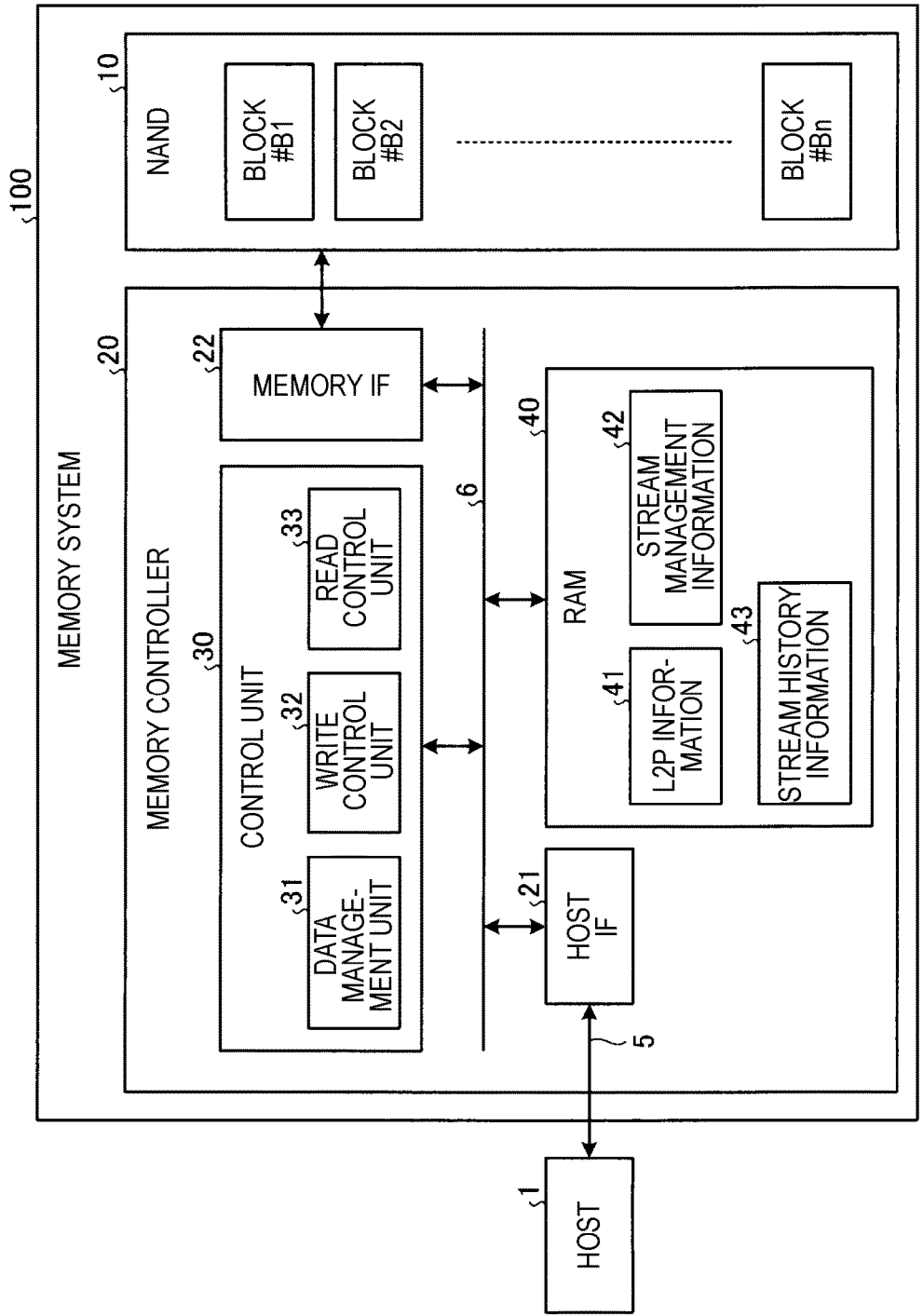
FIG. 1 is a block diagram illustrating a configuration example of a memory system.

FIG. 1 is a block diagram illustrating an exemplary configuration of a memory system 100 according to a first embodiment. The memory system 100 is connected to a host device (hereinafter, referred to as a "host") 1 via a communication line 5 and functions as an external storage device of the host 1. The host 1 may be, for example, an information processing device such as a personal computer, a mobile phone, an imaging device, a portable terminal such as a tablet computer or a smartphone, a game device, or an onboard terminal such as a car navigation system.

The host 1 includes a CPU and a memory. The CPU is a processor configured to execute various programs loaded into the memory. The various programs include an operating system and application programs. The operating system of the host 1 manages file creation, storage, update, and deletion, and the like. The application programs are configured to exchange data with the memory system 100 via the operating system.

The memory system 100 includes a NAND type flash memory (hereinafter, referred to as "NAND") 10 as a nonvolatile memory, and a memory controller 20. The nonvolatile memory is not limited to the NAND type flash memory but may be a three-dimensional structure flash memory, a resistance random access memory (ReRAM), a ferroelectric random access memory (FeRAM), a cross point type memory, a phase change memory (PCM), a magnetoresistive random access memory (MRAM), or the like.

The NAND 10 has a plurality of blocks #B1, #B2, ..., #Bn. A block is a unit of data erasure. Each block has a plurality of memory cells, each of which is capable of implementing multi-level storage. Each block #B1, #B2, ..., #Bn includes a plurality of pages. Data reading and writing are executed on a per page basis. Data may be written in a page only once per erase cycle.

The NAND 10 stores user data transmitted from the host 1, management information of the memory system 100, firmware, and the like. The firmware operates a CPU (not shown) that implements at least some of functions of a control unit 30 of the memory controller 20. The firmware may be stored in a ROM (not shown). The management information includes logical/physical conversion information (L2P information) and the like.

The memory controller 20 includes a host interface (host IF) 21, a memory interface (memory IF) 22, the control unit 30, a RAM 40, and a bus 6 connecting these components. In the present embodiment, the RAM 40 is provided inside the memory controller 20. Alternatively, the RAM 40 may be provided outside the memory controller 20.

The host IF 21 receives a write request and a read request from the host 1. The write request includes a write command, a write address, and write data. The read request includes a read command and a read address. The host IF 21 transfers the received write request or read request to the control unit 30. Further, the host IF 21 transmits the user data read from the NAND 10, a response of the control unit 30, and the like to the host 1.

The RAM 40 is a volatile semiconductor memory capable of conducting a higher speed access than the NAND 10. As the RAM 40, a static random access memory (SRAM) or a dynamic random access memory (DRAM) is used. The management information stored in the NAND 10 is loaded into the RAM 40. The RAM 40 stores L2P information 41, stream management information 42, and stream history information 43 as the management information. The L2P information 41, the stream management information 42, and the stream history information 43 are backed-up in the NAND 10.

The control unit 30 controls the respective components of the memory system 100. The control unit 30 includes a data management unit 31, a write control unit 32, and a read control unit 33. The control unit 30 implements its functions by one or more CPUs and peripheral circuits executing the firmware loaded in the RAM 40. The data management unit 31 implements its functions by the CPUs and/or hardware executing the firmware. The write control unit 32 implements its functions by the CPUs and/or hardware executing the firmware. The read control unit 33 implements its functions by the CPUs and/or hardware executing the firmware.

The data management unit 31 manages the user data by using the L2P information 41 which is one of the management information loaded into the RAM 40. A mapping that associates a logical address used by the host 1 with a physical address of the NAND 10 is registered in the L2P information 41. As the logical address, for example, logical block address (LBA) is used. The physical address indicates a storage location on the NAND 10 in which data is stored. Upon receiving the write request from the host 1, the data management unit 31 uses the L2P information 41 to convert the logical write address into a physical write address, and determines a real address on the NAND 10 in which the write data is to be written. Upon receiving the read request from the host 1, the data management unit 31 converts the logical read address into a physical read address and determines a real address on the NAND 10 from which data is to be read.

The data management unit 31 uses block management information (not shown), which is one of the management information, to execute management of blocks included in the NAND 10. As the block management information, for example, the following block management information is managed.

Number of times of erase in the unit of block (erase count)
Information that distinguishes whether a block is an active block or a free block
Block address of bad block Valid data is recorded in the active block. No valid data is recorded in the free block. The free block may be reused as an erased block after data is erased. Valid data is data associated with the logical address, and invalid data is data not associated with the logical address. The erased block becomes an active block when data is written. The bad block does not operate properly due to various factors and is not usable.

The data management unit 31 executes compaction (also referred to as garbage collection). In the memory system. 100, because the unit of data erase (e.g., block) is different from the unit of data read/write (e.g., page), as rewriting of the NAND 10 progresses, the block is fragmented by invalid data. As such fragmented blocks increase, less blocks are available. Therefore, for example, when the free block of the NAND 10 becomes smaller than a predetermined threshold, compaction is executed to increase the number of free blocks. In the compaction, the valid data is collected from a block containing the valid data and the invalid data, and rewritten into another block.

The data management unit 31 executes a data invalidation process. Upon receiving a data invalidation request from the host 1, the data management unit 31 executes the data invalidation process. The data invalidation request includes a data invalidation command and a logical address to be invalidated. The data invalidation request corresponds to, for example, the UNMAP command in the small computer system interface (SCSI) standard and the TRIM command in the advanced technology attachment (ATA) standard. Upon receiving the data invalidation request from the host 1, the data management unit 31 accesses the L2P information 41 to invalidate the association between the logical address specified by the data invalidation command and the physical address.

In accordance with the write request received from the host 1, the write control unit 32 executes a process for writing data in the NAND 10. Upon receiving the write request from the host 1, the write control unit 32 acquires from the data management unit 31 the physical address on the NAND 10 where the write data is to be written, and outputs the acquired physical address and the write data to the memory IF 22.

The read control unit 33 performs control for reading data from the NAND 10 according to the read request received from the host 1. The read control unit 33 acquires from the data management unit 31 the physical address on the NAND 10 corresponding to the logical address of the read data and outputs the obtained physical address to the memory IF 22.

The memory IF 22 writes the write data in the NAND 10 by outputting the write data and the physical address supplied from the write control unit 32 to the NAND 10. The memory IF 22 reads the read data from the NAND 10 by outputting the physical address input from the read control unit 33 to the NAND 10. The memory IF 22 may include an error correcting code (ECC) circuit which performs an error correction encoding process on the data transferred from the write control unit 32 to generate parity. The ECC circuit outputs a code word including the data and the parity to the NAND 10. The ECC circuit uses the code word read from the NAND 10 to execute an error correction decoding process, and transfers the decoded data to the read control unit 33.

The operating system of the host 1 supports the multi-stream write operation. In the multi-stream, the host 1 associates data expected to have similar lifetimes, such as data contained in the same file, with a stream having the same stream ID. Upon receiving a stream write request with a stream ID designated from an application program, the operating system generates a write request including the stream ID designated by the stream write request, and transmits the generated write request to the memory system 100. Alternatively, instead of the application program requesting the operating system to issue a request specifying the stream. ID, the operating system itself of the host 1 may perform a process of specifying the stream ID based on a predetermined rule or policy.

In order to reduce the execution frequency of the compaction, the memory system 100 supports the multi-stream write operation, in addition to the normal write operation. In the normal write operation, according to a predetermined block selection rule, a write destination of write data is selected from any blocks not allocated for stream write, and the write data is written in the selected block. The memory system 100 writes data associated with a first stream ID into one or more blocks associated with the first stream ID. In addition, the memory system 100 writes data associated with a second stream ID into one or more blocks associated with the second stream ID. When the host 1 deletes data, since there is a high possibility that all data associated with the same stream ID are simultaneously invalidated, the memory system 100 is capable of reducing the number of times compaction is executed by supporting the multi-stream write operation, thereby preventing performance deterioration and lifetime shortening of the NAND 10.

Figure 2:
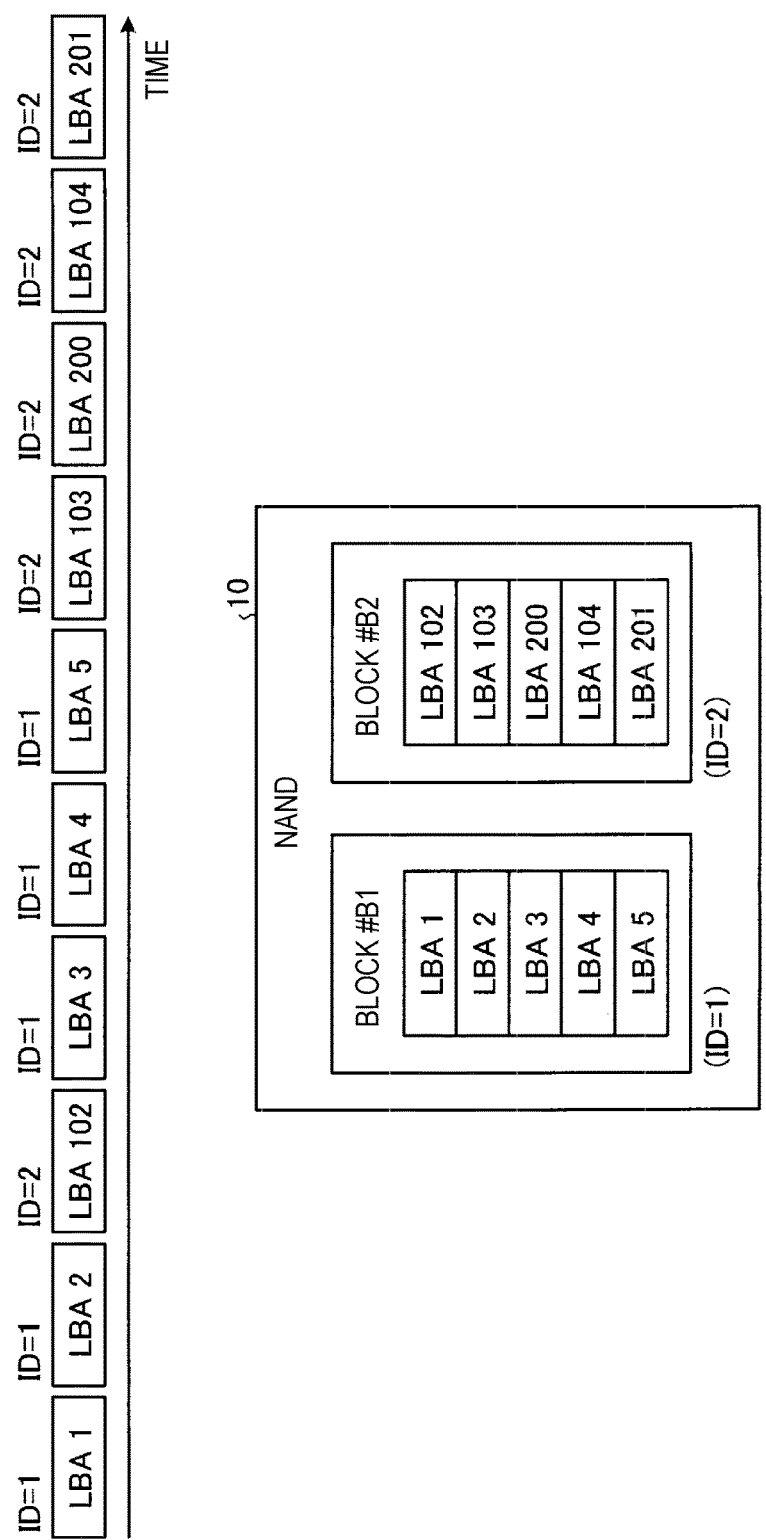
FIG. 2 is a conceptual view of a write operation in a multi-stream.

FIG. 2 is a conceptual view of a write operation in a multi-stream. Data with a stream ID 1 (data specified by LBA 1, data specified by LBA 2, data specified by LBA 3, data specified by LBA 4, and data specified by LBA 5) are written in the erased block #B1 allocated for the stream of ID 1. Data with a stream ID 2 (data specified by LBA 102, data specified by LBA 103, data specified by LBA 200, data specified by LBA 104, and data specified by the LBA 201) are written in the erased block #B2 allocated for the stream of ID 2.

The policy for the host 1 to assign a stream ID is arbitrarily determined by each application. For this reason, there is a possibility that allocation of the stream ID is inappropriate, the data size is small, or a multi-stream write request occurs. In this case, the utilization efficiency of blocks of the NAND 10 decreases and a write amplification factor (WAF) increases, which causes lifetime shortening and performance deterioration of the NAND 10.

FIG. 3 illustrates a state where the same stream ID is specified for data having different lifetimes. H1, H2, H3, H4, and H5 indicate hot data with high frequency of updates. W1 and W2 indicate warm data with low frequency of updates. C1, C2, C3, C4, and C5 indicate cold data with very low frequency of updates or no updates. The data W1, H1, C1, C2, C3, and H2 are associated with a stream with ID=1 and stored in the same block #B4. The data C4, C5, W2, H3, H4, and H5 are associated with a stream with ID=2 and stored in the same block # B5. In this case, the total data size of each stream ID matches the block size. In the case of FIG. 3, there is a high possibility that the hot data H1, H2, H3, H4, and H5 and the warm data W1 and W2 become invalid data as the writing proceeds, and the fragmentation of blocks progresses, which results in compaction.

FIG. 4 illustrates a state where the data size is smaller than the stream granularity size (SGS). In the multi-stream, the memory system 100 notifies the host 1 of the SGS. The memory system 100 desires that the total data size of one stream ID is an integral multiple of the SGS. For example, the SGS is set to one or more block sizes. Data W1, W2, W3, and W4 are associated with a stream with ID=1 and stored in the same block #B6. Data H1 is associated with a stream with ID=2 and stored in the same block #B7. Data C1, C2, and C3 are associated with a stream with ID=3 and stored in the same block #B8. In this case, it is assumed that the block size matches the SGS. In this case, since the data size of the write data sent from the host 1 is much smaller than the SGS, a useless empty area indicated by a broken line is generated in the blocks.

Therefore, in the present embodiment, the memory system 100 collects the stream history information 43 for each stream ID for determining whether or not the allocation of a stream ID is an appropriately managed write access. Regarding a stream ID determined not to be appropriately managed, the control is moved to data management of a normal write request and not multi-stream. That is, regarding the stream ID determined not to be appropriately managed, the association between the stream ID and the block ID is invalidated or broken, and so, the same block management as that performed in the normal write processing is executed. Therefore, in the present embodiment, the utilization efficiency of blocks of the NAND 10 is improved so that long-lifetime of the memory system 100 is achievable.

FIG. 5 is a view illustrating a data structure of the stream management information 42 managed by the data management unit 31. Stream management information indicating the association between the stream ID and one or more block IDs in which data added with the same stream ID is written is stored in the stream management information 42. FIG. 5 shows an example in which the blocks #B5 and #B6 are used to write data associated with the stream of ID 1, and the block #B7 is used to write data associated with the stream of ID 2.

FIG. 6 is a view illustrating a data structure of the stream history information 43 managed by the data management unit 31. In FIG. 6, the stream history information 43 is managed for each stream ID. In this embodiment, the following four pieces of information are collected as the stream history information 43 for each stream ID.

(a) Data size
(b) Total number of invalidated clusters
(c) Compaction execution count
(d) Access frequency information set in stream write command Prior to the detailed description of the above four pieces of information, an open stream command and a close stream command will be described. The open stream command is a command requesting the opening of a stream. Upon receiving the open stream command from the host 1, the data management unit 31 allocates a new stream ID, which is different from the currently opened stream ID, for a newly opened stream. The data management unit 31 allocates a block in which data is to be written for the newly opened stream. Then, the data management unit 31 transmits a response including this newly opened stream ID to the host 1. The host 1 executes a stream write request by using the received stream ID.

The close stream command is a command requesting the closing of an opened stream. The close stream command includes a parameter indicating a stream ID of a stream to be closed. Upon receiving the close stream command from the host 1, the data management unit 31 invalidates the association between the stream ID designated by the close stream command and a block corresponding to this stream ID in the stream management information 42. Then, the data management unit 31 transmits a response including a command completion notification to the host 1.

First, a data size 43a in FIG. 6 will be described. The stream write command includes Number of Logical Blocks (NLB) indicating the size of write data specified by the command. The total size of the write data is calculated for each stream ID by sequentially adding NLBs included in a plurality of write commands added with the same stream ID. Every time the stream write command is received, the data size for each stream ID is added and updated. For example, when a write to a block corresponding to a multi-stream is generated, the total size of the write data is acquired and compared with a threshold corresponding to the SGS. The SGS is the basic data management size for each stream ID. In the memory system 100, for example, one or more block sizes are set as the SGS. Physical resource size information 43b in FIG. 6 indicates the total size of one or more blocks secured for each stream ID. The physical resource size information 43b corresponds to one or more SGSs. A difference $\Delta S$ between the data size 43a of each stream and SGS is obtained. For a stream having the difference $\Delta S$ larger than a predetermined threshold, it is determined that appropriate data allocation is not performed, the multi-stream management is eliminated, and then, the normal data management is executed. That is, the association between the stream ID and the block ID of the stream management information 42 is invalidated, and then, the same block management as that performed in the normal write processing is executed. With such control, when the data size is much smaller than the SGS as illustrated in FIG. 4, it is determined that appropriate data allocation is not performed.

Next, the invalidated cluster number 43c in a block will be described. A cluster refers to an addressing unit of a logical space and a physical space of the NAND 10. For example, in the L2P information 41, addressing is mapped on a cluster basis. The cluster is, for example, a management unit obtained by dividing a page of the NAND 10 into a plurality of pages. When cluster invalidation occurs due to a data invalidation request from the host 1 or due to update of data (e.g., as a result of writing data for the same LBA), the invalidated cluster number is counted for each stream ID. For a stream whose ratio to the physical resource size information 43b having a size corresponding to the invalidated cluster number exceeds a predetermined threshold, it is determined that appropriate data allocation has not been performed, and then, the normal data management is executed.

Next, the compaction execution count 43d will be described. When a block to be managed in a multi-stream (hereinafter, referred to as a "stream management block") is included in a compaction target block, the number of times of compaction is calculated for each stream ID. For example, when data in a block A managed with the stream ID 1 is moved to a block B by compaction, the number of times of compaction of the stream ID 1 is set to one. Next, when data in the block B is also moved to a block by compaction, the number of times of compaction of the stream ID 1 is set to twice. For a stream whose compaction number exceeds a predetermined threshold, it is determined that appropriate data allocation has not been performed, and then, the normal data management is executed.

Next, the access frequency information (AF value) 43e will be described. Each stream write command transmitted by the host 1 includes Dataset Management indicating the attribute of an LBA designated by the write command, and the Dataset Management includes AF information. The AF information indicates the access frequency of the LBA designated by the write command. For example, when a 4-bit AF value is 0001, this indicates that the access frequency is normal. When the AF value is 0010, this indicates that there is infrequent read and write access. When the AF value is 0011, this indicates that the write access is infrequent and the read access is frequent. When the AF value is 0101, this indicates that there is frequent read and write access. When the AF value is 0110, this indicates that there is only one write. In this way, the AF value represents the concept similar to the lifetime. When the AF value differs between write commands having the same stream ID, it is determined that appropriate data allocation is not performed. When the AF value of the previous stream write command differs from the AF value of the current stream write command, an AF determination flag 43f in FIG. 6 is set to 1.

A close flag (closed FG) 43g in FIG. 6 indicates whether or not the relevant stream ID is closed. When the close flag is 1, the stream ID is closed, and when the close flag is 0, the stream ID is opened.

Figure 7:
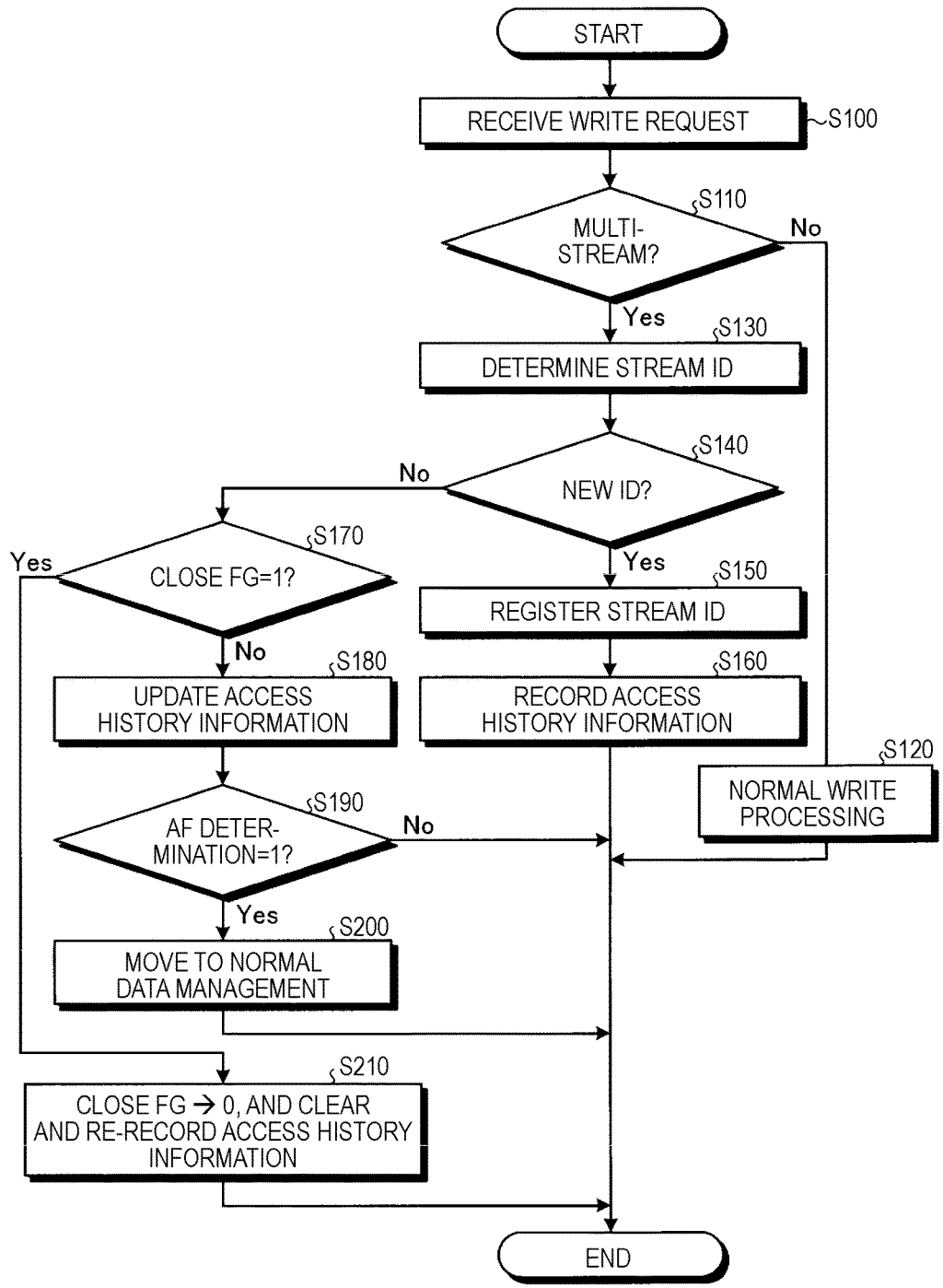
FIG. 7 is a flowchart illustrating an operation procedure of a control unit when a write request is received.

FIG. 7 is a flowchart illustrating the operation procedure of the data management unit 31 when a write request is received. Upon receiving a write request from the host 1 via the host IF 21 (S100), the data management unit 31 determines whether the write request is a stream write command or a normal write command (S110). When it is determined that the write request is not a stream write command but a normal write command ("No" in S110), the data management unit 31 executes the normal write processing (S120). In the normal write operation, as described above, according to the predetermined block selection rule, a write destination of write data is selected from any blocks not allocated for stream write, and the write data is written in the selected block. According to this write processing, the data management unit 31 updates the L2P information 41.

When it is determined that the write request is a stream write command ("Yes" in S110), the data management unit 31 determines whether or not a stream ID added to the write command is a new stream ID, based on the stream management information 42 (S130 and S140). When it is determined that the stream ID added to the write command is a new stream ID ("Yes" in S140), the data management unit 31 registers the new stream ID in the stream management information 42 (S150). Further, the data management unit 31 determines a block in which data of this new stream ID is to be written, and registers a block ID of the determined block in the stream management information 42. Further, the data management unit 31 determines a write address including the determined block ID and inputs data specified by the determined write address and the stream write command to the NAND 10 via the RAM 40 and the memory IF 22. As a result, the data specified by the stream write command is written in the NAND 10. According to this write processing, the data management unit 31 updates the L2P information 41.

Meanwhile, according to this write processing, the data management unit 31 registers required information in the stream history information 43 (S160). Specifically, the data management unit 31 creates a new entry corresponding to the new stream ID in the stream history information 43. The data management unit 31 acquires an NLB included in the stream write command and records the acquired NLB in a column of the data size 43a of the new entry. Further, the data management unit 31 registers the size of one or more blocks secured for the new stream ID in a column of the physical resource size information 43b. Further, the data management unit 31 acquires the AF value included in the stream write command and records the acquired AF value in a column of the AF value 43e of the new entry.

When it is determined in the step S140 that the stream ID added to the stream write command is not a new stream ID ("No" in S140), the data management unit 31 determines whether the stream. ID is an opened ID or a closed ID, based on the close flag 43g of the stream history information 43 (S170). When it is determined that the stream ID specified by the stream write command is a closed ID ("Yes" in S170), the data management unit 31 determines that a new stream write request has occurred for the closed stream ID, and re-opens the closed stream ID by changing the close flag of the closed stream ID from 1 to 0. Further, the data management unit 31 registers the re-opened stream ID in the stream management information 42. Further, the data management unit 31 determines a block in which data of the re-opened stream ID is to be written, and registers a block ID of the determined block in the stream management information 42. Further, the data management unit 31 determines a write address including the determined block ID and inputs data specified by the determined write address and the stream write command to the NAND 10 via the memory IF 22. As a result, the data specified by the stream write command is written in the NAND 10. According to this write processing, the data management unit 31 updates the L2P information 41.

Further, the data management unit 31 clears the information recorded in the entry of the re-opened stream ID and records the required information corresponding to the current stream write command (S210). Specifically, the data management unit 31 acquires an NLB included in the stream write command and records the acquired NLB in the column of the data size 43a. Further, the data management unit 31 registers the size of one or more blocks secured for the re-opened stream ID in the column of the physical resource size information 43b. Further, the data management unit 31 acquires the AF value included in the stream write command and records the acquired AF value in the column of the AF value 43e. In addition, the information recorded in the entry of the re-opened stream ID may not be cleared but may be kept as a history.

When it is determined in the step S170 that the stream ID added to the stream write command is an open stream ID ("No" in S170), the data management unit 31 acquires from the stream management information 42 a block ID of a block in which data of this stream ID is to be written. The data management unit 31 determines a write address including the acquired block ID and inputs data specified by the determined write address and the stream write command to the NAND 10 via the memory IF 22. As a result, the data specified by the stream write command is written in the NAND 10. According to this write processing, the data management unit 31 updates the L2P information 41.

Meanwhile, according to this write processing, the data management unit 31 updates required information of the stream history information 43 (S180). Specifically, the data management unit 31 acquires an NLB included in the stream write command, adds the acquired NLB to the data size recorded in the column of the data size 43a of the stream ID added to the stream write command, and updates the data size with this addition result. In addition, when it is necessary to increase the block in which the data of the stream ID is to be written by the current write processing, the data management unit 31 determines a new block in which data is to be written, and additionally registers a block ID of the determined block in the stream management information 42. Further, in association with this additional registration, the physical resource size information 43b of the stream history information 43 is updated.

Furthermore, when data update occurs by the current stream write command, that is, when writing of data for the same LBA as the LBA in which data is written occurs, the data management unit 31 counts the number of clusters invalidated by the data update and records the counted number of invalidated clusters in the column of invalidated cluster number 43c. Further, the data management unit 31 acquires the AF value included in the stream write command and compares the acquired AF value with the AF value recorded in the stream history information 43. When the AF values match with each other, the AF determination flag 43f is set to 0. When the values do not match with each other, the AF determination flag 43f is set to 1. When the AF determination flag 43f is 1 ("Yes" in S190), the data management unit 31 determines that appropriate stream data allocation is not performed for this stream ID, and, regarding this stream ID, the control is moved to data management of the normal write request (S200). That is, regarding the stream ID for which it is determined that appropriate data allocation is not performed, the association between the stream ID and the block ID of the stream management information 42 is invalidated, and then, the same block management as in the normal write processing is executed. When the AF determination flag 43f is 0 ("No" in S190), the data management unit 31 ends the procedure.

FIG. 8 is a flowchart illustrating a processing procedure for determining data allocation of each stream based on the data size 43a managed by the stream history information 43. When a read request occurs, the data management unit 31 determines whether or not this read request is a request for a block to be subjected to stream management, based on the L2P information 41 and the stream management information 42 (S300). The data management unit 31 acquires from the L2P information 41 a physical address associated with a logical address designated by the read request and determines whether or not a block ID including the acquired physical address is registered in the stream management information 42. When the block ID is registered in the stream management information 42, the data management unit 31 determines that the block is a block to be subjected to stream management. When the determination in the step S300 is "Yes," the data management unit 31 acquires from the stream management information 42 a stream ID of the block in which the read request occurs, and acquires from the stream history information 43 the data size 43a recorded in the entry of the acquired stream ID. The data management unit 31 obtains a difference ΔS between the acquired data size and the SGS (S310). The data management unit 31 compares the difference ΔS with a threshold (S320). When the difference ΔS is larger than the threshold ("Yes" in S320), the data management unit 31 determines that appropriate stream data allocation is not performed for this stream ID, and, regarding this stream ID, the control is moved to data management of the normal write request (S330). That is, regarding the stream ID for which it is determined that appropriate stream data allocation is not performed, the data management unit 31 invalidates the association between the stream ID and the block ID of the stream management information 42, and then, executes the same block management as in the normal write processing. Regarding a stream in which the difference ΔS is smaller than the threshold ("No" in S320), the stream management is continued. Such control makes it possible to eliminate the occurrence of useless empty areas shown in FIG. 4.

FIG. 9 is a flowchart illustrating an operation procedure of the data management unit 31 when compaction is executed. The data management unit 31 executes compaction (S400). After executing the compaction, the data management unit 31 determines whether or not a stream management block is included in a target block of the current compaction. When it is determined that the stream management block is included, the data management unit 31 acquires a stream ID of the compaction target block from the stream management information 42. The data management unit 31 counts the number of times of compaction of the acquired stream ID, adds the counted compaction number to the compaction number recorded in the column of the compaction number 43d of this stream ID, and updates the compaction number with a result of the addition (S410).

Next, the data management unit 31 compares the updated compaction number with a predetermined threshold (S420). When the compaction number exceeds the threshold ("Yes" in S420), the data management unit 31 determines that appropriate stream data allocation is not performed for this stream ID, and, regarding this stream ID, the control is moved to data management of the normal write request (S440). When the compaction number does not exceed the threshold ("No" in S420), the stream management is continued.

Further, the data management unit 31 acquires the invalidated cluster number 43c and the physical resource size information 43b of the stream ID of the current compaction target block. The data management unit 31 calculates the invalidated cluster size based on the invalidated cluster number, calculates the ratio of the calculated invalidated cluster size to the physical resource size information 43b, and compares the ratio with a predetermined threshold (S430). When the ratio exceeds the threshold ("Yes" in S430), the data management unit 31 determines that appropriate stream data allocation is not performed for this stream. ID, and, regarding this stream ID, the control is moved to data management of the normal write request (S440). When the ratio does not exceed the threshold ("No" in S430), the stream management is continued.

FIG. 10 is a flowchart illustrating an operation procedure of the data management unit 31 when data invalidation processing such as UNMAP is executed. Upon receiving a data invalidation request from the host 1, the data management unit 31 executes data invalidation processing (S500). With this data invalidation processing, the association between the logical address and the physical address designated by the data invalidation command is invalidated in the L2P information 41. Based on the L2P information 41 and the stream management information 42, the data management unit 31 determines whether or not the data of data invalidation target is managed as a stream. When it is determined that the data of data invalidation target is managed as a stream, the data management unit 31 acquires from the stream management information 42 a stream ID of a block in which the data of data invalidation target is stored, and furthermore counts the number of clusters invalidated by the data invalidation processing in the step S500 for each stream ID.

The data management unit 31 adds the counted invalidated cluster number of each stream ID to the invalidated cluster number recorded in the column of the invalidated cluster number 43c of each stream ID, and updates the invalidated cluster number of each stream ID with a result of the addition (S510). After this updating, the data management unit 31 acquires the invalidation cluster number and the physical resource size information 43b for all stream IDs registered in the stream history information 43. The data management unit 31 calculates the invalidated cluster size for each stream ID based on the invalidation cluster number. The data management unit 31 calculates the ratio of the invalidated cluster size to the physical resource size for each stream ID, and compares the calculated ratio with a predetermined threshold (S520). For a stream in which the ratio exceeds the threshold ("Yes" in S520), the data management unit 31 determines that appropriate data allocation is not performed, and regarding this stream ID, the control is moved to data management of the normal write request (S530). When the ratio does not exceed the threshold ("No" in S520), the stream management is continued.

In this manner, in the first embodiment, the stream history information 43 for determining whether or not the data allocation is an appropriately managed write access is collected for each stream ID, and the control is moved to data management of the normal write request for a stream ID determined not to be appropriately managed. Therefore, in this embodiment, the utilization efficiency of blocks of the NAND 10 is improved, thereby achieving long-lifetime of the memory system.

In the above description, when a read request for data stored in the stream management block occurs, it is determined whether or not the data size of the corresponding stream ID is appropriate. Alternatively, it may be determined whether or not the data size is appropriate at any other timings. For example, in response to a request from the host 1, it may be determined whether or not the data size of each stream ID is appropriate. In the above description, whether or not the invalidated cluster number is appropriate is determined at the time of compaction execution or at the time of execution of the data invalidation instruction. Alternatively, every time data invalidation occurs, it may be determined whether or not the invalidated cluster number is appropriate. In the above description, every time a stream write command is received, it is determined whether or not the AF values match, and, when a mismatch with the AF value of the previous write command occurs even once, it is determined that the setting of the AF value is inappropriate. Alternatively, when mismatches of Y or more AF values occur in X write commands, it may be determined that the setting of the AF value is inappropriate. Where, X is 3 or more, and Y≤X. Further, in accordance with a request from the host 1, it may be determined whether or not the invalidated cluster number, the number of times of compaction or the AF value is appropriate.

When the storage capacity of a user data area of the NAND 10 falls below a predetermined threshold, multi-stream management may be stopped and switched to the normal data management for a stream ID for which data allocation is determined to be appropriate. The user data area is an area in which write data received from the host 1 is written, among all the storage areas of the NAND 10. In addition, the AF value of 0100 or 0100 means data for which writing occurs frequently. Therefore, in a case where the capacity of the NAND 10 has no margin and the storage capacity of the NAND 10 falls below a predetermined threshold, when a stream write command with the AF value of 0100 or 0100 is received, the multi-stream management is stopped and it may be switched to the normal data management.

Second Embodiment

In a second embodiment, the memory system 100 provides the collected stream history information 43 to the host 1. The configuration of the memory system. 100 according to the second embodiment is the same as that of the memory system 100 illustrated in FIG. 1, and therefore, overlapping explanation thereof will be omitted. FIG. 11 is a flowchart illustrating an operation procedure of the data management unit 31 providing the stream history information 43 to the host 1. The host 1 requests the memory system 100 to transmit a stream history at an appropriate timing (S600). Upon receiving this request ("Yes" in S600), the data management unit 31 collects information (the data size 43a, the physical resource size information 43b, the invalidated cluster number 43c, the compaction number 43d, the AF value 43e, and the AF determination flag 43f), except for the close FG 43g among the information managed in the stream history information 43 for each stream ID and transmits the collected stream history information 43 to the host 1 (S610).

Upon receiving the stream history information 43 for each stream ID from the memory system 100, the host 1 specifies, for example, a stream ID for which appropriate data allocation is not performed, specifies an application corresponding to the specified stream ID, and modifies multi-stream management of the specified application. For example, the host 1 allocates no stream ID to the specified application.

In this manner, in the second embodiment, since the stream history is transmitted to the host 1, the host 1 may specify an application that issued the stream ID for which appropriate data allocation is not performed. Therefore, in the host 1, inefficient stream access may be suppressed, and the memory usage efficiency of the memory system 100 may be improved, thereby achieving long-lifetime of the memory.

Instead of using a request from the host 1 as a trigger, the memory system 100 may voluntarily transmit the stream history information 43 to the host 1. Further, a request specifying a stream ID may be transmitted from the host 1 to the memory system 100, and the memory system 100 may transmit the stream history information 43 on the designated stream ID.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
    a nonvolatile memory having a plurality of blocks; and
    a memory controller configured to control the nonvolatile memory, record an association between a first stream ID and a first block in which first data corresponding to the first stream ID is written, collect information on the first data written into the first block, and invalidate the association between the first stream ID and the first block based on the collected information,
    wherein the information is a compaction count for the first data, and the memory controller is configured to invalidate the association if the compaction count is larger than a first threshold.

2. The memory system according to claim 1, wherein the memory controller is configured to transmit the collected information to a host.

3. The memory system according to claim 1, wherein the memory controller is configured to collect the information upon receiving from a host a write command in which the first stream ID is specified.

4. The memory system according to claim 1, wherein the information includes a data size of the first data, and the memory controller is configured to invalidate the association if a difference between the data size of the first data and a predetermined size is larger than a second threshold.

5. The memory system according to claim 4, wherein the predetermined size is equal to one or more block sizes.

6. The memory system according to claim 1, wherein the information is a ratio of size of invalidated data of the first data to size of the first block, and the memory controller is configured to invalidate the association if the ratio is larger than a third threshold.

7. The memory system according to claim 1, wherein the information is access frequency of first and second portions of the first data written into the first block in response to first and second commands, respectively, and the memory controller is configured to invalidate the association if the access frequency of the first portion is different from the access frequency of the second portion.

8. The memory system according to claim 7, wherein the first and second commands are consecutive commands to write to the first block.

9. The memory system according to claim 1, wherein the memory controller is further configured to invalidate the association between the first stream ID and the first block if a storage capacity of a user data area of the nonvolatile memory falls below a predetermined threshold.

10. In a memory controller for nonvolatile memory having a plurality of blocks, a method of performing multi-stream control, comprising:
    recording an association between a first stream ID and a first block in which first data corresponding to the first stream ID is written;
    collecting information on the first data written into the first block; and
    invalidating the association between the first stream ID and the first block based on the collected information,
    wherein the information is a ratio of size of invalidated data of the first data to size of the first block, and the association is invalidated if the ratio is larger than a first threshold.

11. The method according to claim 10, further comprising:
    transmitting the collected information to a host.

12. The method according to claim 10, wherein the information is collected upon receiving from a host a write command in which the first stream ID is specified.

13. The method according to claim 10, wherein the information includes a data size of the first data, and the association is invalidated if a difference between the data size of the first data and a predetermined size is larger than a second threshold.

14. The method according to claim 13, wherein the predetermined size is equal to one or more block sizes.

15. The method according to claim 10, wherein the information is a compaction count for the first data, and the association is invalidated if the compaction count is larger than a third threshold.

16. The method according to claim 10, wherein
    the information is access frequency of first and second portions of the first data written into the first block in response to first and second commands, respectively, and
    the association is invalidated if the access frequency of the first portion is different from the access frequency of the second portion.

17. The method according to claim 16, wherein the first and second commands are consecutive commands to write to the first block.

18. The method according to claim 10, wherein the association is invalidated if a storage capacity of a user data area of the nonvolatile memory falls below a predetermined threshold.

19. A memory system comprising:
    a nonvolatile memory having a plurality of blocks; and
    a memory controller configured to control the nonvolatile memory, record an association between a first stream ID and a first block in which first data corresponding to the first stream ID is written, collect information on the first data written into the first block, and invalidate the association between the first stream ID and the first block based on the collected information, wherein the information includes access frequency of first and second portions of the first data written into the first block in response to first and second commands, respectively, and the memory controller is configured to invalidate the association if the access frequency of the first portion is different from the access frequency of the second portion.

20. The memory system according to claim 19, wherein the information includes a compaction count for the first data, and the memory controller is configured to invalidate the association if the compaction count is larger than a first threshold.

* * * * *